United States Patent [19]

Matsumoto et al.

[11] Patent Number: 5,134,092

[45] Date of Patent: Jul. 28, 1992

[54] PROCESS FOR FORMING DEPOSITED FILM AND PROCESS FOR PRODUCING SEMICONDUCTOR DEVICE

[75] Inventors: Shigeyuki Matsumoto, Atsugi; Osamu Ikeda, Yokohama; Kazuaki Ohmi, Hadano, all of Japan

[73] Assignee: Canon Kabushiki Kaisha, Tokyo, Japan

[21] Appl. No.: 587,844

[22] Filed: Sep. 25, 1990

[30] Foreign Application Priority Data

Sep. 26, 1989 [JP] Japan .................. 1-250015
Sep. 26, 1989 [JP] Japan .................. 1-250016

[51] Int. Cl.$^5$ .................. H01L 21/44; H01L 21/48; H01L 21/90
[52] U.S. Cl. .................. 437/192; 437/187; 437/189; 437/200
[58] Field of Search .......... 437/192, 189, 200, 187; 556/57

[56] References Cited

U.S. PATENT DOCUMENTS 3,816,491 6/1974 Wilkinson .................. 556/57
4,349,408 9/1982 Tarng et al. .................. 156/628

FOREIGN PATENT DOCUMENTS 0216157 4/1987 European Pat. Off. .
0254651 6/1987 European Pat. Off. .

OTHER PUBLICATIONS

Vossen et al., The Film Processes, Academic Press, Inc., NY 1978 pp. 615-617.
M. Diem et al., "Properties & Chemically Vapor-Deposited Tungsten Thin Films on Silicon Wafers", Thin Solid Films, vol. 107, No. 1, pp. 39-43, Sep. 1983.

*Primary Examiner*—Brian E. Hearn
*Assistant Examiner*—Kevin M. Picardai
*Attorney, Agent, or Firm*—Fitzpatrick, Cella, Harper & Scinto

[57] ABSTRACT

A process for forming a deposited film comprises the steps of;
(a) disposing in a space for forming a deposited film a substrate having an electron donative surface;
(b) introducing to the space for forming a deposited film i) a gas comprising an organic metal compound containing a tungsten atom and ii) a hydrogen gas; and
(c) forming a tungsten film on the electron donative surface.

9 Claims, 4 Drawing Sheets

PROCESS FOR FORMING DEPOSITED FILM AND PROCESS FOR PRODUCING SEMICONDUCTOR DEVICE

BACKGROUND OF THE INVENTION

1. Field of the Invention

The present invention relates to a process for forming a deposited film and a process for producing a semiconductor device. More particularly, the present invention relates to a process for forming a tungsten (W) deposited film preferably applicable in wiring a semiconductor integrated circuit device or the like, and a process for producing a semiconductor device using a method of selectively depositing a tungsten film.

2. Related Background Art

Aluminum (Al) has been hitherto mainly used in electrodes or wiring, in electronic devices or integrated circuits which are comprised of semiconductor. Here, Al has a number of advantages such that it is inexpensive, has a high electrical conductivity, and is capable of giving such a dense oxide film on a surface that its inside can be chemically protected and stabilized or a good adhesion to Si can be achieved.

Incidentally, particularly in recent years, it has become required for the wiring to be made finer and to be formed in more multiple layers because of an increase in the degree of integration of integrated circuits such as LSI, etc. Hence, demands for conventional Al wiring has become far severer than ever. As the size is made finer with an increase in the degree of integration, the surface of an LSI or the like is made greatly uneven as a result of oxidation, diffusion, deposition of thin films, etching, etc. For example, electrodes or wiring metals must be deposited without disconnection on the surface having differences in level or must be deposited in via holes having a minute diameter and a large depth. In the case of 4 Mbit or 16 Mbit DRAM (dynamic RAM), etc., the aspect ratio (i.e., via hole depth/via hole diameter) of a via hole in which metals such as Al, etc. must be deposited is 1.0 or more, and the diameter itself of a via hole is 1 μm or less. Hence, a technique is needed which enables deposition of Al in a via hole having a large aspect ratio.

In particular, in order to achieve a sure connection to a device located beneath an insulating film made of $SiO_2$ or the like, the Al must be deposited in the manner that via holes only of a device can be filled up rather than a film is formed therein.

Then, because of a low melting point of Al which is as low as 660° C. or a weakness in its electromigration, studies have been made on tungsten (W) as a wiring material that substitutes Al.

As a method of forming deposited film of tungsten, a CVD process is proposed in which $WF_6$ is used as a starting material gas and W is deposited on an Si substrate by reduction reaction with Si which is a constituent atom of the substrate.

For example, U.S. Pat. No. 4,349,408 discloses a process comprising depositing on a silicon substrate a polycrystalline silicon layer doped with oxygen, subsequently depositing thereon a polycrystalline silicon layer doped with phosphorus, thereafter etching the polycrystalline silicon layer, and depositing a tungsten film on the silicon substrate uncovered by the etching.

European Patent Publication No. 216157(A2) discloses a metal depositing process comprising the steps of (1) placing in a chamber a silicon substrate having a silicon dioxide layer, provided with a hole, (2) feeding a gaseous compound of a metal into the chamber to substitute the silicon of the substrate with the metal so that the metal is deposited to the hole and (3) feeding hydrogen gas together with a gaseous metal so that a metal is further deposited on both the surfaces of the metal thus deposited and the silicon dioxide film; wherein an etching gas is fed into the chamber in the course of the step (3) and the etching gas is activated to carry out etching in such a manner that the silicon dioxide layer can be kept in a state in which no metal is present on its surface and also a metal can be further deposited on the metal deposited layer. As an example, this publication discloses the deposition of tungsten (W).

In the processes disclosed in these publications, however, $WF_6$ is used as a starting material, and the tungsten film is basically deposited as a result of the reaction between $WF_6$ and Si. Hence, making uniform the deposition of W on Si may result in a great lowering of the rate of deposition, and on the other hand making sure the rate of deposition may bring about its deposition also on $SiO_2$. Thus, it has been often difficult to stably maintain the selectivity. Further it is difficult to avoid that the Si substrate is corroded because of the materials used or the etching gas. Moreover, in some instances, the rate of deposition is from 30 to 50 Å/min at best and the film thickness has a limit of from about 2,000 Å to about 3,000 Å for a stable thickness. There is also an difficulty about the problem of contamination of an interface between the Si substrate and the tungsten film because of the presence of fluorine. There is also plenty of room for improvement in respect of the uniformity of a film.

On the other hand, from the viewpoints of the formation of wiring and the formation of electrodes, a poor surface roughness of a tungsten thin film obtained by a conventional film forming process has brought about inconveniences of the alignment step for a mask and a substrate and the etching step, in a patterning step for the wiring.

More specifically, a tungsten film formed by conventional sputtering and a tungsten film formed by CVD have surfaces with irregularities ranging from several hundred to several thousand Å to have a poor surface morphology. This has often brought about the following disadvantages:

1) Alignment signals are irregularly reflected on the surface, so that the noise level becomes too high to distinguish inherent alignment signals.
2) In order to cover large surface irregularities, a resist film must be made to have a large thickness. This is contradictory to the demands for fineness.
3) The poorness in surface morphology brings about local halation ascribable to the internal reflection in a resist, causing the resist to remain.
4) The poorness in surface morphology makes side walls rugged in accordance with the irregularities in the course of wiring etching step.

Nevertheless, because of the melting point of tungsten which is as high as 3,410° C., there is the advantage that employment thereof as a wiring material makes it possible to carry out a high-temperature treatment in a posterior step in a process of manufacturing a semiconductor device. It has been impossible to ignore this advantage.

As discussed above, in the technical field of semiconductors that have been recently sought to be more highly integrated, there is plenty of room for improvement in order to inexpensively provide a semiconductor device having a high-integration and a high-performance.

SUMMARY OF THE INVENTION

The present invention was made in view of the above technical problems.

A first object of the present invention is to provide a process for forming a deposited film, that can form a tungsten film with a good quality as a conductor in a good controllability.

A second object of the present invention is to provide a process for forming a deposited film, that can form a flat and dense film with a thick thickness without damage of a substrate.

A third object of the present invention is to provide a process for forming a deposited film, that can deposit a good-quality tungsten also in minute via holes.

A fourth object of the present invention is to provide a process for forming a deposited film, that can form a deposited film having good properties as a barrier metal.

A fifth object of the present invention is to provide a process for forming a deposited film, that can form a deposited film in which tungsten can be readily formed into silicide.

A sixth object of the present invention is to provide a process for forming a deposited film, that can form a deposited film with good properties in a good selectivity.

A seventh object of the present invention is to provide a process for producing a semiconductor device which is characteristic of superior surface flatness, migration resistance and so forth, using a method of selectively forming a tungsten film.

Another object of the present invention other than the above objects is to provide a process for forming a deposited film, comprising the steps of;

(a) disposing in a space for forming a deposited film a substrate having an electron donative surface;

(b) introducing to said space for forming a deposited film i) a gas comprising an organic metal compound containing a tungsten atom and ii) a hydrogen gas; and (c) forming a tungsten film on said electron donative surface.

Another object of the present invention is to provide a process for forming a deposited film, comprising the steps of;

(a) disposing in a space for forming a deposited film a substrate having an electron donative surface (A) and an electron non-donative surface (B);

(b) introducing to said space for forming a deposited film i) a gas comprising an organic metal compound containing a tungsten atom and ii) a hydrogen gas; and (c) selectively forming a tungsten film on said electron donative surface (A).

Another object of the present invention is to provide a process for producing a semiconductor device, comprising the steps of;

forming on a semiconductor material a film comprising an insulating material;

forming a hole in said film so that said semiconductor material is uncovered; and filling up said hole with a conductive material to form part of electrical wiring;

wherein tungsten is selectively deposited in said hole by the reaction between i) a gas comprising an organic metal compound containing a tungsten atom and ii) a hydrogen gas to form said part of electrical wiring.

DETAILED DESCRIPTION OF THE PREFERRED EMBODIMENTS

A preferred embodiment of the process of the present invention for forming a deposited film is as follows:

The process of the present invention for forming a deposited film is characterized in that a tungsten film is formed on an electron donative surface by the reaction between i) a gas comprising an organic metal compound containing a tungsten atom and ii) a hydrogen gas.

As for a preferred embodiment of the process of the present invention for forming a semiconductor device is as follows:

The process of the present invention for forming a semiconductor device is characterized in that tungsten is selectively deposited on a semiconductor material surface uncovered at part of an insulating film formed thereon, by the reaction between i) a gas comprising an organic metal compound containing a tungsten atom and ii) a hydrogen gas to form part of electrical wiring.

In the process of the present invention for forming a deposited film, tungsten is deposited by a simple thermal reaction in a reaction system comprising i) a gas comprising an organic metal compound containing tungsten (a starting material gas) and ii) a hydrogen gas. More specifically, a mixed gas comprising, for example, $W(CH_3)_6$ as a starting material gas and $H_2$ as a reaction gas is fed onto a substrate which is heated to the range of a suitable temperature not lower than the decomposition temperature of $W(CH_3)_6$, and the pressure in the space for forming a deposited film is set to a suitable level, so that tungsten is precipitated out on the surface and a continuous film is formed, which grows to a deposited film. Thus, according to the process of the present invention for forming a deposited film, a low-resistivity, dense and flat tungsten film can be selectively deposited on a substrate. In the process of the present invention that employs the substrate having an electron donative surface (A) and an electron non-donative surface (B), the deposited film can be formed with a very superior selectivity.

According to the process of the present invention for producing a semiconductor device, it is possible to provide a superior semiconductor device in which a low-resistivity, dense and flat tungsten film is employed at its wiring part, electrode part and so forth.

Preferred embodiments of the present invention will be described below with reference to the accompanying drawings.

In the present invention, CVD (chemical vapor deposition) is used to deposit on a substrate a tungsten film having a good quality as a conductive deposited film.

In the present invention, for example, W(CH$_3$)$_6$ which is an organic metal is used as a starting material gas containing at least one atom that serves as a constituent element of the deposited film, and H$_2$ is used as a reaction gas. A tungsten film is formed on a substrate by gaseous phase growth using a mixed gas of these.

Used as the substrate applicable in the present invention is a material having electron donative properties to form a surface on which tungsten is deposited. In order to form a deposited film with a very superior selectivity, it is possible to use a substrate comprising a first substrate surface material having electron donative properties and a second substrate surface material having electron non-donative properties.

This "electron donative" will be described below in detail.

The electron donative material refers to a material capable of constituting a substrate in which free electrons are present or free electrons have been intentionally produced, and is exemplified by a material having a surface that can accelerate chemical reaction because of electron transfer between a substrate and the starting material gas molecules adhered to the surface of the substrate. Such a material includes, for example, metals, p-type semiconductors, n-type semiconductors, and intrinsic semiconductors. It also includes metals and semiconductors on the surface of which a very thin oxide film is present. If it is such a thin film, the chemical reaction can take place because of the electron transfer between a substrate and starting material gas molecules adhered to the substrate.

The electron donative material specifically includes semiconductors such as monocrystalline silicon, polycrystalline silicon and amorphous silicon, binary, tertiary or quaternary type Group III-V compound semiconductors comprising a combination of a Group III element such as Ga, In or Al and a Group V element such as P, As or N, or Group II-VI compound semiconductors, as well as metals themselves such as tungsten, molybdenum, tantalum, aluminum, titanium, copper, etc. It also includes silicides of the above metals, as exemplified by tungsten silicide, molybdenum silicide, tantalum silicide, aluminum silicide, titanium silicide, etc. It may further include metals containing any one of the constituent atoms of the above metals, as exemplified by aluminum silicon, aluminum titanium, aluminum copper, aluminum tantalum, aluminum silicon copper, aluminum silicon titanium, aluminum palladium, titanium nitride, etc.

On the other hand, a material that forms a surface on which no tungsten is selectively deposited, i.e., an electron non-donative material includes usual insulating materials, silicon oxides formed by thermal oxidation, CVD, etc., glasses such as BSG (borosilicate glass), PSG (phosphosilicate glass), BPSG (borophosphosilicate glass), etc. or oxide films thereof, thermal nitride films of silicon, and silicon nitride films formed by plasma CVD, reduced pressure CVD, ECR-CVD, etc.

On the substrate thus constituted, tungsten is deposited by a simple thermal reaction in the reaction system comprising the starting material gas and H$_2$. For example, the thermal reaction in the reaction system comprising W(CH$_3$)$_6$ and H$_2$ is presumed to basically proceed as follows:

W(CH$_3$)$_6$ + 4H$_2$ → W↓ + 6CH$_4$↑ + H$_2$↑

Figure 1:
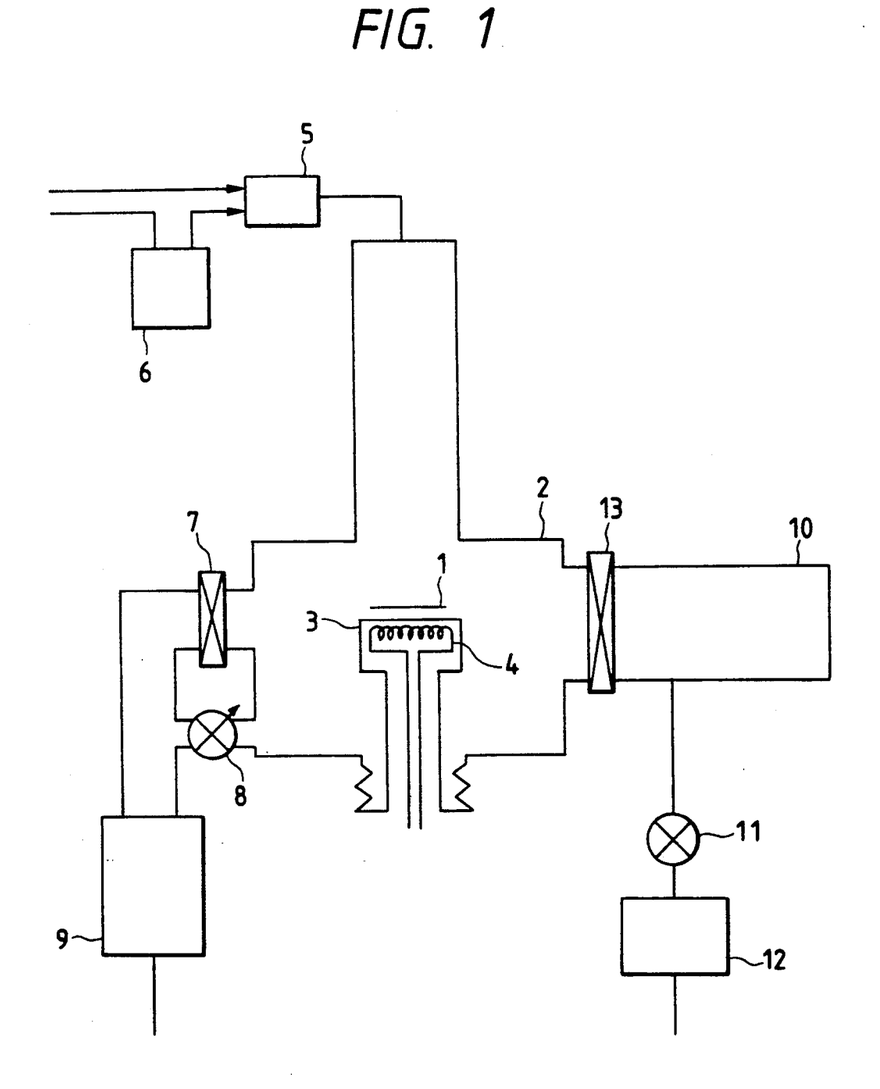
FIG. 1 is a diagrammatic illustration of an example of an apparatus for forming a deposited film, to which the present invention can be applied.

FIG. 1 is a diagrammatic illustration of an apparatus for forming a deposited film, to which the present invention can be applied.

In FIG. 1, the numeral 1 denotes a substrate for forming the tungsten film. As shown in FIG. 1, the substrate 1 is placed on a substrate holder 3 provided inside a reaction tube 2 that forms a substantially closed space for forming a deposited film. As a material that constitutes the reaction tube 2, quartz is preferred. It may also be made of a metal. The reaction tube should preferably be cooled. The substrate holder 3 is made of, for example, a metal, and provided with a heater 4 so that the substrate placed thereon can be heated. The heater 4 is so constituted that a heating temperature can be controlled and thereby a substrate temperature can be controlled.

A gas feeding system is constituted as follows:

The numeral 5 denotes a gas mixing unit, in which the starting material gas and the reaction gas are mixed and from which the mixed gas is fed to the inside of the reaction tube 2. The numeral 6 denotes a starting material gas sublimation chamber, provided in order to sublimate an organic metal to the starting material gas.

Since the organic metal used in the present invention is solid at room temperature, it is sublimated by heating in the sublimation chamber 6, formed to become a saturated vapor in company with a carrier gas, and then led into the mixing unit 5. The sublimation chamber may preferably be previously heated to, for example, 180° C.±10° C.; and piping, the mixing unit 5 and the reaction tube 2, to, for example, 170° C.±10° C.

An exhaust system is constituted in the following way:

The numeral 7 denotes a gate valve, which is opened when exhaust is carried out in a large volume as in the case when the inside of the reaction tube 2 is evacuated before the formation of a deposited film. The numeral 8 denotes a slow-leak valve, which is utilized when exhaust is carried out in a small volume as in the case when the inside pressure of reaction tube 2 is controlled at the time of the formation of a deposited film. The numeral 9 denotes an exhaust unit and comprises an exhaust pump, etc. such as a turbo-molecular pump, etc.

A transport system for the substrate 1 is constituted as follows.

The numeral 10 denotes a substrate transport chamber capable of holding a substrate before the deposited film is formed and after the deposited film has been formed, and is evacuated by opening a valve 11. The numeral 12 denotes an exhaust unit for evacuating the transport chamber and comprises an exhaust pump such as a turbo-molecular pump, etc.

A valve 13 is opened only when the substrate 1 is transferred between the reaction chamber and the transport chamber.

As shown in FIG. 1, the sublimation chamber 6 is kept at, for example, 180° C. so that the starting material gas can be produced. For example, H$_2$ or Ar (or other inert gas) serving as a carrier gas is flowed to W(CH$_3$)$_6$, whereby gaseous W(CH$_3$)$_6$ is formed, which is then sent to the mixing unit 5. The H$_2$ serving as the reaction gas is sent to the mixing unit 5 from another route. Gas flow rates are controlled so as for each partial pressure to be at the desired values.

FIGS. 2A to 2E are diagrammatic illustrations to show how a tungsten film grows when the present invention is applied in the selective formation of a tungsten film.

Figure 2A:
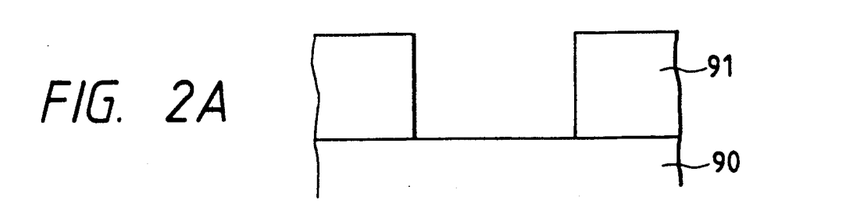
FIGS. 2A to 2E are diagramitic cross-sections to illustrate a process for forming selectively a deposited film according to the present invention.

FIG. 2A is a diagrammatic illustration of a cross-section of a substrate on which the tungsten deposited film has not been formed according to the present invention. The numeral 90 denotes a substrate comprising the electron donative material; and 91, a thin film comprising the electron non-donative material.

Figure 2B:
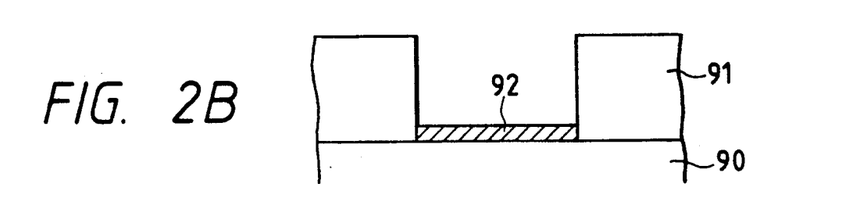

When the mixed gas containing W(CH$_3$)$_6$ as a starting material gas and H$_2$ as a reaction gas is fed onto the substrate heated within a temperature range of 800° C. or less, tungsten is selectively precipitated out on the substrate 90 except for the thin film 91 comprising the electron non-donative material, and a continuous film of tungsten is thus formed as shown in FIG. 2B. Here, the inside of the reaction tube 2 should be at a pressure of from $10^{-3}$ to 760 Torr. The partial pressure of W(CH$_3$)$_6$ may preferably be $1.5 \times 10^{31}$ $^5$ to $1.3 \times 10^{-3}$ times the pressure inside the above reaction tube.

Figure 2C:
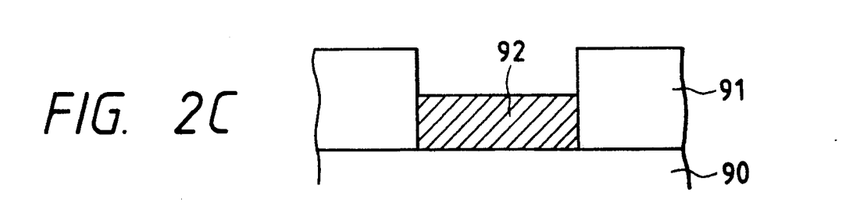
Figure 2D:
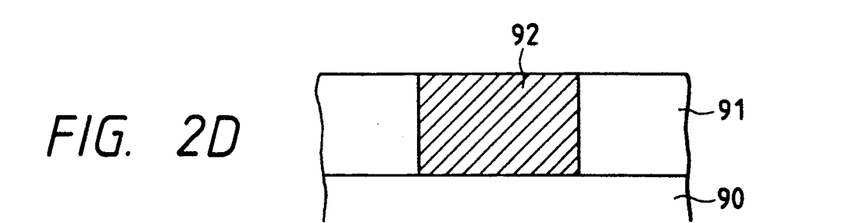
Figure 2E:
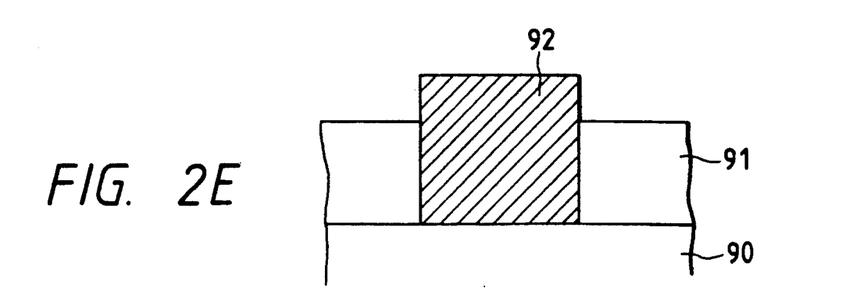

Upon successive deposition of tungsten under the above conditions, the tungsten film grows to an uppermost level of the thin film 91 as shown in FIG. 2D through the state as shown in FIG. 2C. Upon making the film to grow further under the same conditions, the tungsten film can grow to a thickness of 5,000 Å without little growth in the lateral direction. This is most characteristic point of the deposited film formed according to the present invention. Thus, it will be readily understood how a film with a good quality can be formed in a good selectivity according to the process of the present invention for forming a deposited film.

As a result of analyses made by Auger electron spectroscopy or photoelectron spectroscopy, no impurities such as carbon or oxygen are seen to be included in the resulting film.

The deposited film thus formed has a good resistivity of from 8 to 10 $\mu\Omega$·cm at room temperature when it is formed in a film thickness of 400 Å, and gives a continuous and flat film. Even when in a film thickness of 1 $\mu$m, the film still has a resistivity of from about 8 to 10 $\mu\Omega$·cm at room temperature. Thus, a sufficiently dense film can be formed even when it is a thick film. The film also has a reflectance of about 80% at a visible light wavelength region, and thus a thin film with a superior surface flatness can be deposited.

In the course of the formation of the deposited film, the substrate temperature should be controlled to be not lower than the decomposition temperature of the starting material gas containing tungsten, and be not higher than 800° C. A substrate temperature higher than 800° C. may bring about the possibility of the decomposition of methyl groups. Stated specifically, the substrate temperature should be in the range of from 300° to 500° C. When the tungsten is deposited under this condition, the rate of deposition is as very high as from 100 Å/min to 200 Å/min at a partial pressure of W(CH$_3$)$_6$ of $10^{-4}$ to $10^{-3}$ Torr. Thus, a sufficiently high rate of deposition can be achieved in a tungsten deposition technique for super-LSIs.

The substrate temperature may more preferably be in the range of from 350° C. to 452° C. A tungsten film deposited under such conditions can be strongly oriented and has a superior oxidation resistance in posterior steps.

In the apparatus as shown in FIG. 1, the tungsten can be deposited on only one sheet of substrate at one deposition. Thus, this apparatus, although can achieve a rate of deposition of about 200 Å/min, is not necessarily satisfactory as an apparatus for carrying out deposition on a number of substrates in a short time.

As a deposited film forming apparatus that can improve this point, there is a reduced pressure CVD apparatus capable of depositing tungsten on a number of wafers simultaneously loaded in it. The deposition of tungsten according to the present invention utilizes a surface reaction that takes place on a heated surface of an electron donative substrate. Hence, it is possible to preferably deposit tungsten by the use of W(CH$_3$)$_6$ and H$_2$ if hot wall type reduced pressure CVD is used.

The deposited film should be formed under conditions of a reaction tube pressure of from 0.05 to 760 Torr, and preferably from 0.1 to 0.8 Torr, a substrate temperature of from 300° C. to 800° C., and preferably from 350° C. to 450° C., and a W(CH$_3$)$_6$ gas partial pressure of from $1.5 \times 10^{-5}$ to $1.3 \times 10^{-3}$ times the pressure inside the reaction tube. Under these conditions, tungsten can be deposited only on the electron donative substrate.

Figure 3:
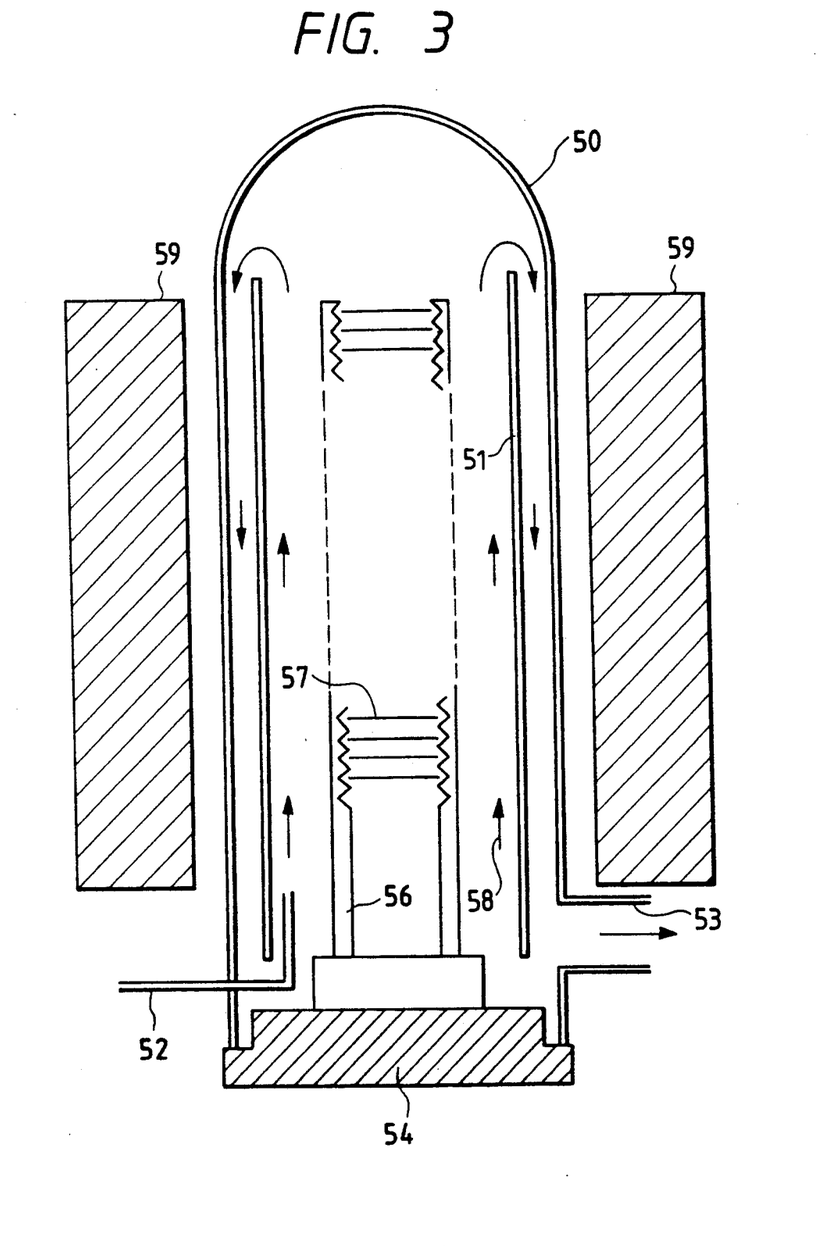
FIG. 3 is a diagrammatic illustration of another example of an apparatus for forming a deposited film, to which the present invention can be applied.

FIG. 3 is a diagrammatic illustration of such an apparatus for forming a deposited film, that can form the deposited film according to the present invention.

In FIG. 3, the numeral 57 denotes a substrate on which a tungsten film is formed. The numeral 50 denotes an outer reaction tube made of quartz, that forms a space for forming a deposited film, substantially closed to its surroundings; and 51, an inner reaction tube made of quartz, that is disposed for the purpose of separating a gas flow inside the outer reaction tube 50. The numeral 54 denotes a flange made of a metal, that opens or shuts an opening of the outer reaction tube 50. The substrate 57 is disposed inside a substrate holding fixture 56 provided inside the inner reaction tube 51. The substrate holding fixture 56 should be made of quartz.

This apparatus can control the substrate temperature by means of a heater unit 59. The pressure inside the reaction tube 50 is so designed as to be controllable by means of an exhaust system connected through a gas exhaust vent 53.

Like the apparatus as shown in FIG. 1, a starting material gas feed system comprises a first gas feed system, a second gas feed system and a mixing unit (all not shown in FIG. 3), and the starting material gas is introduced into the reaction tube 50 through a gas feed line 52. The first gas feed system, the mixing unit and the starting material gas feed line 52 are each provided with a heating mechanism. The starting material gas, when it passes through the inside of the inner reaction tube 51 as shown by arrows in FIG. 3, reacts on the surface of the substrate 57, and thus tungsten is deposited on the surface of the substrate. The gas having been used in the reaction is passed through the gap formed between the inner reaction tube 51 and the outer reaction tube 50, and exhausted from the gas exhaust vent 53.

When substrates are taken in and out, the flange 54 made of a metal is brought down using an elevator (not shown), together with the substrate holding fixture 56 and the substrates 57 until the flange is moved to a given position, where the substrates are attached or detached.

Using such an apparatus, deposited films may be formed under the conditions as previously described, so that good tungsten films with good quality can be simultaneously formed on all the wafers in the apparatus.

As described above, the film obtained by the process for forming a tungsten film according to the present invention is dense, has impurities such as carbon, etc. in only a very small quantity, has a low resistivity, and also has a high surface flatness. Because of these properties, the present invention can bring about remarkable effects as stated below.

(1) Decrease in resistivity

Tungsten has the advantages that it has a melting point of as high as 3,410° C. and is hardly affected by heat treatment in a posterior step. However, tungsten obtained by conventional methods has a resistivity of as high as 18 to 30 $\mu\Omega\cdot$cm when obtained by sputtering, and about 10 $\mu\Omega\cdot$cm when obtained by CVD.

Employment of the deposition process according to the present invention makes it possible to obtain tungsten having a low resistivity of from 8 to 9 $\mu\Omega\cdot$cm. In addition, the film can be readily made to have a large thickness.

(2) Improvement in deposition rate

In conventional methods, the rate of deposition of tungsten ranges from 30 to 50 Å/min. On the other hand, employment of the deposition process according to the present invention makes it possible to obtain a deposition rate of 200 Å/min at a maximum.

It is also possible to simultaneously process 250 sheets of wafers when the apparatus as shown in FIG. 3 is used.

(3) Fill-up of contact holes

The present invention is basically attributable to the surface reaction between an organic metal compound containing a tungsten atom as exemplified by $W(CH_3)_6$, and $H_2$, which occurs on an electron donative substrate. According to the present invention, by virtue of utilization of the surface reaction between the organic metal compound and $H_2$, the inside of via holes (contact holes) can be completely filled up with tungsten, and the tungsten in the via holes can be made to have a resistivity of sufficiently as low as 10 $\mu\Omega\cdot$cm.

(4) Improvement in surface flatness (Improvement in patterning performance for wiring)

The poorness in surface morphology of tungsten films formed by conventional sputtering or CVD as previously discussed has the possibility of giving bad influences on semiconductors and the fabrication of semiconductors. The present invention, however, has brought about an epock-making improvement in the surface morphology of the tungsten film, and can eliminate all the above disadvantages.

(5) Perfect selectivity

Tungsten films formed by conventional CVD using $WF_6$ are basically attributable to the reaction between $WF_6$ and Si. Hence, making uniform the deposition of W on Si may result in a great lowering of the rate of deposition, and on the other hand making sure the rate of deposition may bring about its deposition also on $SiO_2$. Thus, in order to stably maintain the selectivity, the tungsten film has a limit in its thickness of from 2,000 Å to 3,000 Å. However, employment of the deposition process of the present invention as a selective deposition process can achieve a perfect selectivity up to a thickness of 10,000 Å. Tungsten is deposited only on the surface having electron donative properties, e.g., on Si, and is not deposited on the surface having electron non-donative properties, e.g., on $SiO_2$.

The present invention will be described below by giving Examples.

EXAMPLE 1

A tungsten film was formed in the following way: Using the apparatus as shown in FIG. 1, the inside of the reaction tube 2 was evacuated to about $1 \times 10^{-8}$ Torr by means of the exhaust system 9. However, a tungsten film can be formed even if the inside of the reaction tube 2 has a lower degree of vacuum than $1 \times 10^{-8}$ Torr.

After an Si wafer was cleaned, the transport chamber 10 was released to atmospheric pressure, and the Si wafer was loaded in the transport chamber. The transport chamber was evacuated to about $1 \times 10^{-6}$ Torr. Thereafter, the gate valve 13 was opened and then the wafer was fitted to the wafer holder 3.

After the wafer was fitted to the wafer holder 3, the gate valve 13 was shut, and then the inside of the reaction tube 2 was evacuated until it had a degree of vacuum of about $1 \times 10^{-8}$ Torr.

In the present example, $W(CH_3)_6$ was fed from the first gas line. $H_2$ was used as a carrier gas for the $W(CH_3)_6$ line. The second gas line was used for the feeding of $H_2$. The whole of the first gas line, the mixing unit and the reaction tube were heated to 170° C., and the sublimation chamber was heated to 180° C.

$H_2$ gas was flowed from the second gas line, and the pressure in the reaction tube 2 was made to have a given value by controlling the opening of the slow-leak valve 8. In the present example, the pressure was made to be typically about 1.0 Torr. Thereafter, the heater 4 was electrified to heat the wafer. After the wafer temperature reached to a given temperature, $W(CH_3)_6$ was led to the inside of the reaction tube from the gas line for $W(CH_3)_6$. The total pressure was about 1.0 Torr, and the $W(CH_3)_6$ partial pressure was controlled to be about $1.0 \times 10^{-4}$. Upon feeding of $W(CH_3)_6$ in the reaction tube 2, tungsten was deposited. After lapse of a given deposition time, the feeding of $W(CH_3)_6$ was stopped. Next, the heating of the heater 4 was stopped, and the wafer was cooled. The feeding of $H_2$ gas was stopped and the inside of the reaction tube was evacuated. Thereafter, the wafer was transferred to the transport chamber, and only the transport chamber was released to atmospheric pressure. The wafer was then taken out.

The foregoing is an outline of the procedure for forming a tungsten film.

Next, preparation of a sample in the present example is described.

A Si substrate (n-type; 1 to 2 $\Omega\cdot$cm) was subjected to thermal oxidation at a temperature of 1,000° C. according to the hydrogen combustion method ($H_2$:3 lit/M; $O_2$:2 lit/M).

The film thickness of $SiO_2$ thus formed was 7,000 Å±500 Å, and the refractive index was 1.46.

This Si substrate with an $SiO_2$ film formed thereon was coated on its whole surface with a photoresist, and the desired pattern was printed thereon using an exposure machine. The pattern used was the one capable of making various holes of from 0.25 $\mu$m×0.25 $\mu$m to 100 $\mu$m×100 $\mu$m in size. After the photoresist was developed, the ground $SiO_2$ was etched by reactive iron etching (RIE), etc., making the photoresist to serve as a mask. As a result, the substrate Si was partially uncovered. In this way, a sample having holes in $SiO_2$ with various sizes of from 0.25 $\mu$m×0.25 $\mu$m to 100 $\mu$m×100 $\mu$m was prepared, on which a tungsten film was deposited according to the procedures as described above and under conditions of:

| Total pressure | 1.0 Torr |
| --- | --- |
| W(CH$_3$)$_6$ partial pressure | 1.0 × 10$^{-4}$ Torr |

Tungsten films were deposited with changes in the substrate temperature, and were evaluated using various evaluation methods. Results obtained are shown in Table 1.

TABLE 1

|  | 180° C. | 300° C. | 350° C. | 450° C. | 500° C. | 800° C. |
| --- | --- | --- | --- | --- | --- | --- |
| Resistivity: (μΩ · cm) | — | 8–10 | 8–9 | 8–9 | 8–10 | 10 |
| Deposition rate: (Å/min) | 10–20 | 100–200 | 100–200 | 100–200 | 100–200 | <200 |
| Surface irregularities: (μm Rmax) | — | 0–10 | 0–10 | 0–10 | 10–100 | 10–200 |

As will be evident from Table 1, tungsten films with a low resistivity, a flat film surface and a practically usable deposition rate were obtainable at a temperature range of from 300° C. to 450° C. It was also confirmed that tungsten was deposited only in holes of SiO$_2$ and was not deposited on SiO$_2$. In addition, this selectivity was maintained even in continuous deposition carried out for 1 hour.

EXAMPLE 2

In the present example, Ar was used as a carrier gas in the first gas line used for the feeding of W(CH$_3$)$_6$.

Tungsten was deposited according to the same procedure as in Example 1 and under conditions of:

| Total pressure | 1.0 Torr |
| --- | --- |
| W(CH$_3$)$_6$ partial pressure | 1.0 × 10$^{-4}$ Torr |

Tungsten film thus deposited showed good results like those in Example 1.

The selective deposition characteristics on the substrate were also as good as in Example 1.

EXAMPLE 3

Using the reduced pressure CVD apparatus as shown in FIG. 3, a tungsten film was formed on a substrate having the constitution as described below.

First, on a monocrystalline silicon or the like serving as a first substrate surface material having electron donative properties, an oxide film or the like serving as a second substrate surface material having electron non-donative properties was formed. Next, patterning was carried out by the photolithographic step as shown in Example 1 so that the monocrystalline silicon surface was partially uncovered.

Here the film of the second substrate surface material had a film thickness of 7,000 Å. The area at which the monocrystalline silicon or the like was partially uncovered, i.e., the hole had a size of 3 μm × 3 μm. In this way, samples as shown below were prepared. (In the following, a sample thus formed is referred to as "BPSG by normal pressure CVD/monocrystalline silicon").

BPSG by normal pressure CVD/monocrystalline silicon
PSG by normal pressure CVD/monocrystalline silicon
SiN by plasma CVD/monocrystalline silicon
SiN by plasma CVD/polycrystalline silicon
SiO by plasma CVD/polycrystalline silicon
SiO by plasma CVD/monocrystalline silicon
BPSG by normal pressure CVD/Al
BPSG by normal pressure CVD/W
BPSG by normal pressure CVD/polycrystalline silicon
PSG by normal pressure CVD/Al
PSG by normal pressure CVD/W
PSG by normal pressure CVD/polycrystalline silicon These samples, and also an Al$_2$O$_3$ substrate and an SiO$_2$ glass substrate, were put in the reduced pressure CVD apparatus as shown in FIG. 3, and tungsten films were formed thereon in the same batch. Films were formed under conditions of a reaction tube pressure of 0.3 Torr, a W(CH$_3$)$_6$ partial pressure of 3.0 × 10$^{-5}$ Torr, a substrate temperature of 350° C. and a film formation time of 10 minutes.

As a result of the film formation carried out under such conditions, tungsten film was deposited only on the first substrate surface having electron donative properties and thus the hole was filled up, in respect of every sample to which the patterning had been applied. The tungsten film exhibited the same quality as the one shown in Example 1, formed at a substrate temperature of 350° C., and was found very good. On the other hand, no tungsten film was deposited at all on the second substrate surface having electron non-donative properties. Thus, a perfect selectivity was obtained. Tungsten film was not deposited at all also on the electron non-donative, Al$_2$O$_3$ substrate and SiO$_2$ glass substrate.

EXAMPLE 4

An Si substrate having subjected to thermal oxidation was made ready for use, and polycrystalline silicon was deposited on its whole surface by conventional reduced pressure CVD. This polycrystalline silicon was selectively removed by conventional photolithography.

On the above sample, tungsten was deposited using the apparatus as shown in FIG. 1, according to the same procedures and the same conditions as in Example 1.

The deposited film thus formed had the same properties as in Example 1, and tungsten was deposited only on the polycrystalline silicon, i.e., a electron donative substrate. Namely, no tungsten was deposited on SiO$_2$. This sample was heat-treated in an N$_2$ atmosphere of 900° C. to carry out formation of tungsten into a silicide (formation of an alloy of Si and W). As a result, tungsten silicide having superior oxidation characteristics and a low resistance, having a resistivity of 30 μΩ·cm was obtained.

EXAMPLE 5

Using the reduced pressure CVD apparatus as shown in FIG. 3 as in Example 3, tungsten film was formed on a substrate having the constitution as described below.

First, on the surface of a monocrystalline silicon serving as a first substrate surface material having electron donative properties, phosphorus of $10^{20}$ cm$^{-3}$ was selectively diffused. Next, a thermal oxidation SiO$_2$ film was formed thereon to serve as a second substrate surface material having electron non-donative properties, and patterning was carried out by the general photolithographic step so that the monocrystalline silicon surface was partially uncovered.

Here the film of the thermal oxidation SiO$_2$ film had a film thickness of 8,000 Å. The area at which the monocrystalline silicon was partially uncovered, i.e., the hole had a size of 0.8 μm×0.8 μm In this way, samples were prepared.

These samples were put in the reduced pressure CVD apparatus as shown in FIG. 3, and tungsten films were formed on the plural samples in the same batch. Films were formed under conditions of a reaction tube pressure of 0.3 Torr, a W(CH$_3$)$_6$ partial pressure of 1.0×10$^{-5}$ Torr, a substrate temperature of 350° C. and a film formation time of 50 minutes.

As a result of the film formation carried out under such conditions, tungsten film was deposited only on the silicon substrate surface having electron donative properties and thus the hole with a depth of 8,000 Å was completely filled up, in respect of every sample to which the patterning had been applied. The tungsten film exhibited the same quality as the one shown in Example 1, formed at a substrate temperature of 350° C., and was found very good. On the other hand, no tungsten film was deposited at all on the oxide film surface having electron non-donative properties. Thus, a perfect selectivity was obtained.

The contact resistance between the phosphorus-diffused area of the silicon and the tungsten deposited film was confirmed to be from 1×10$^{-6}$ to 5×10$^{-6}$Ω·cm$^2$. Since a hole of 8,000 Å×8,000 Å was provided in a depth of 8,000 Å, the aspect ratio was 1, and the resistivity of the tungsten in holes was simply determined to find that it was 10 μΩ·cm.

In other words, the insides of via holes were filled with tungsten unless any barrier metal or the like were provided in the via holes, and a good contact resistance and a good in-hole resistance could be obtained.

The corrosion of via hole bottoms, i.e., Si surfaces, and contamination due to fluorine, which were seen in the case of CVD using WF$_6$, were not seen at all.

EXAMPLE 6

According to the same procedures as in Example 1 and under conditions of:

| Total pressure | 1.0 Torr |
| --- | --- |
| Substrate temperature | 400° C. |
| W(CH$_3$)$_6$ partial pressure | 1.0 × 10$^{-4}$ Torr, |

Si$_2$H$_6$ was fed into the reaction tube through a third gas line so as to give a partial pressure of 1×10$^{-5}$ Torr, and the apparatus was so designed that Si was mixed during the reaction between W(CH$_3$)$_6$ and H$_2$.

The deposited film thus obtained was composed of WSi (tungsten silicide, i.e., an alloy of W and Si) and had a resistivity of 60 μΩ·cm. The resistivity was higher than the results obtained in Example 4, but the WSi was formed at a lower temperature and WSi films with characteristics satisfactory for producing MOS transistors was obtained.

EXAMPLE 7

In the same manner as in Example 5, prepared was a sample with a hole of 0.8 μm×0.8 μm made in an SiO$_2$ film and at which Si surface was uncovered.

Subsequently, tungsten was deposited to a thickness of 1000 Å on the above sample according to the same procedures as in Example 1 and under conditions of:

| Total pressure | 1.0 Torr |
| --- | --- |
| Substrate temperature | 400° C. |
| W(CH$_3$)$_6$ partial pressure | 1.0 × 10$^{-4}$ Torr |

As a result, like Example 1, tungsten was deposited only at the hole in a good film quality. Thereafter, on the whole surface of the above sample, Al—0.5% Si—1% Cu were deposited by conventional sputtering method. As to patterning, it was unnecessary to etch tungsten which is a barrier metal. The patterning was finished in the step of etching the Al-Si-Cu. Tungsten deposited in a thickness of 1,000 Å well played a role as a diffusion barrier, and caused no leak even against a narrow junction of about 0.1 μm. No Si was also seen to be precipitated out, and a good contact resistance was also obtained.

EXAMPLE 8

As an example for forming source and drain electrodes of a gate insulating type transistor, formation of an electrode in a contact hole on a source and a drain was carried out using the film forming process of the present invention. This is described with reference to FIG. 4.

Figure 4A:
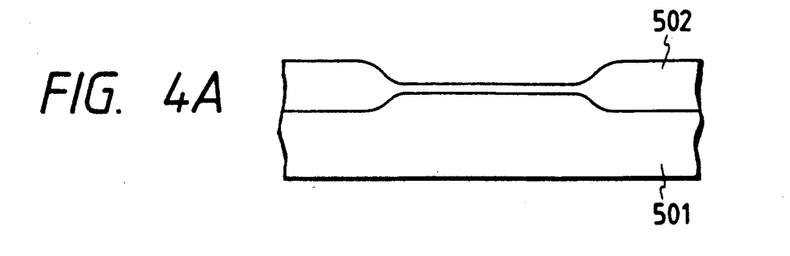
FIGS. 4A to 4E are diagrammatic views to illustrate a process for producing a semiconductor device of the present invention.
Figure 4B:
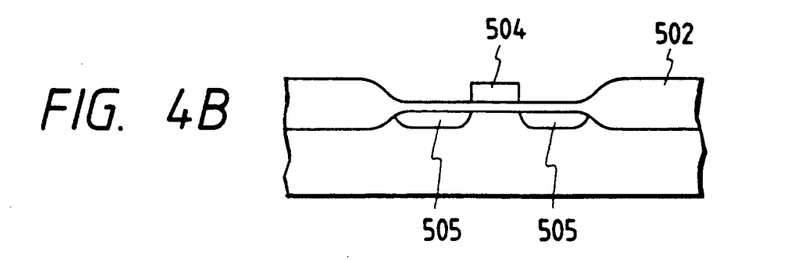
Figure 4C:
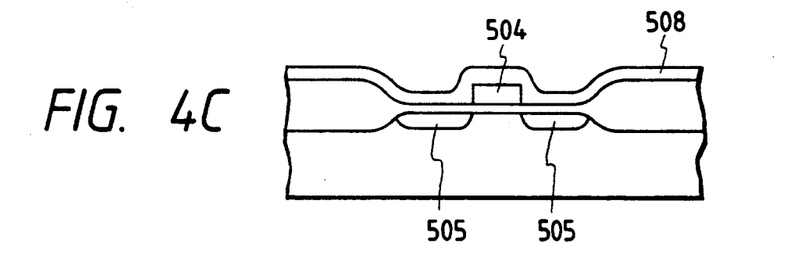
Figure 4D:
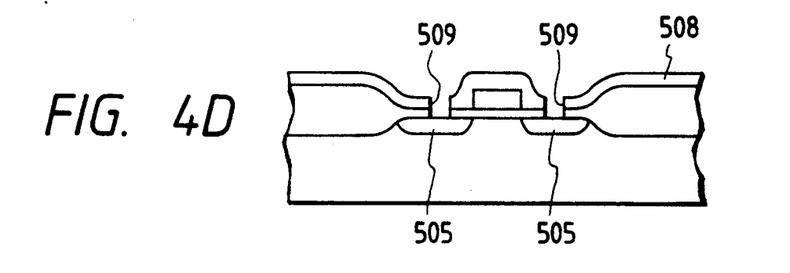

First, on a p-type silicon wafer 501, a thick field oxide film and a thin thermal oxide film 502 were formed by use of the usual selective oxidation process, etc. to wafer 501 (FIG. 4A). Subsequently, using SiH$_4$ gas as a starting material gas, a polycrystalline silicon layer was formed by heat CVD method, and a polycrystalline silicon gate electrode 504 was formed by lithography method. At the same time, phosphorus was self-alignedly injected using the thick field oxide film and gate electrode 504 as a mask to form an impurity-diffused region 505 of 1×10$^{18}$cm$^{-3}$ (FIG. 4B). Next, a silicon oxide film 508 was formed by heat CVD method (FIG. 4C). A contact hole 509 with a size of 0.5 μm×0.5 μm was formed by lithography method (FIG. 4D). The substrate thus obtained was moved to the apparatus as shown in FIG. 1 to form a tungsten film.

Here, the substrate temperature was set to be 350° C. Using W(CH$_3$)$_6$ as a starting material gas and H$_2$ as a carrier gas, a tungsten film was formed under conditions of a W(CH$_3$)$_6$ partial pressure of 1.0×10$^{-4}$ Torr and a total pressure of 1 Torr.

Figure 4E:
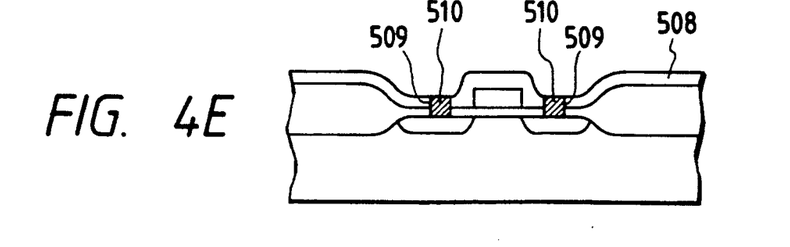

After the formation of the tungsten film was completed, the transistor was taken out of the film forming apparatus and observed, to confirm that a tungsten film 510 was deposited only on the phosphorus-diffused Si 505 in the contact hole 509, and was not deposited on the oxide film 508 (FIG. 4E). The surface of the tungsten film 510 was very flat. Characteristics of the resulting transistor were examined to reveal that very good characteristics were exhibited.

It was also possible to form a thin tungsten film only on the bottom of the contact hole 509 and thereafter form on the thin tungsten film an Al film as an electrode material. It was still also possible to use the tungsten film as a barrier metal.

We claim:

1. A process for forming a deposited film, comprising the steps of:
   (a) disposing in a space for forming a deposited film a substrate having an electron donative surface;
   (b) introducing to said space for forming a deposited film i) a gas comprising an organic metal compound containing a tungsten atom and ii) a hydrogen gas; and
   (c) forming a tungsten film on said electron donative surface by reacting said organic metal compound containing a tungsten atom said hydrogen gas.

2. A process for forming a deposited film according to claim 1, wherein said organic metal compound containing a tungsten atom is $W(CH_3)_6$.

3. A process for forming a deposited film according to claim 1, wherein said electron donative surface comprises a semiconductor.

4. A process for forming a deposited film comprising the steps of:
   (a) disposing in space for forming a deposited film a substrate having an electron donative surface (A) and an electron non-donative surface (B);
   (b) introducing to said space for forming a deposited film i) a gas comprising an organic metal compound containing a tungsten atom and ii) a hydrogen gas; and
   (c) selectively forming a tungsten film on said electron donative surface (A) by reacting said organic metal compound containing a tungsten atom with said hydrogen gas.

5. A process for forming a deposited film according to claim 4, wherein said organic metal compound containing a tungsten atom is $W(CH_3)_6$.

6. A process for forming a deposited film according to claim 4, wherein said electron donative surface (A) comprises a semiconductor.

7. A process for forming a deposited film according to claim 4, wherein said electron non-donative surface (B) comprises an insulator.

8. A process for producing a semiconductor device, comprising the steps of:
   (a) forming on a semiconductor material a film comprising an insulating material;
   (b) forming a hole in said film so that said semiconductor material is uncovered; and
   (c) filling up said hole with a conductive material to form part of an electrical wiring;
   wherein tungsten is selectively deposited in said hole by the reaction between i) a gas comprising an organic metal compound containing a tungsten atom and ii) a hydrogen gas to form said part of an electrical wiring.

9. A process for producing a semiconductor device according to claim 8, wherein said organic metal compound containing a tungsten atom is $W(CH_3)_6$.

* * * * *

UNITED STATES PATENT AND TRADEMARK OFFICE
CERTIFICATE OF CORRECTION

PATENT NO. : 5,134,092

DATED : July 28, 1992

INVENTOR(S) : SHIGEYUKI MATSUMOTO ET AL.

It is certified that error appears in the above-identified patent and that said Letters Patent is hereby corrected as shown below:

On the title page: Item

[56] REFERENCES CITED

Other Publications,
"Properties & Chemically" should read
--Properties of Chemically--.
"The Film Processes," should read
--Thin Film Processes,--.

AT [57] ABSTRACT

Line 2, "of;" should read --of:--.

COLUMN 1

Line 30, "far severer" should read --more severe--.

COLUMN 2

Line 28, "an" should read --a--.

COLUMN 3

Line 39, "of;" should read --of:--.
Line 49, "of;" should read --of:--.
Line 60, "of;" should read --of:--.

COLUMN 4

Line 8, "diagramitic" should read --diagrammatic--.
Line 27, "As for a" should read --A--.

UNITED STATES PATENT AND TRADEMARK OFFICE
CERTIFICATE OF CORRECTION

PATENT NO. : 5,134,092

DATED : July 28, 1992

INVENTOR(S) : SHIGEYUKI MATSUMOTO ET AL.

It is certified that error appears in the above-identified patent and that said Letters Patent is hereby corrected as shown below:

COLUMN 7

Line 16, "$1.5 \times 10^{31\ 5}$" should read --$1.5 \times 10^{-5}$--.
Line 59, "452°C." should read --450°C.--.
Line 65, "although" should read --although it--.

COLUMN 9

Line 46, "epock-making" should read --epoch-making--.

COLUMN 10

Line 61, "iron" should read --ion--.

COLUMN 11

Line 59, "hole" should read --hole,--.

COLUMN 12

Line 46, "An" should read --A-- and
"subjected" should read --been subjected--.

UNITED STATES PATENT AND TRADEMARK OFFICE
CERTIFICATE OF CORRECTION

PATENT NO. : 5,134,092
DATED : July 28, 1992
INVENTOR(S) : SHIGEYUKI MATSUMOTO ET AL.

It is certified that error appears in the above-identified patent and that said Letters Patent is hereby corrected as shown below:

COLUMN 13

Line 12, "hole" should read --hole,--.
    Line 13, "0.8 µmX0.8 µmIn" should read
        --0.8 µmX0.8 µm. In--.

Signed and Sealed this

Eighth Day of February, 1994

Attest:

BRUCE LEHMAN

Attesting Officer      Commissioner of Patents and Trademarks